(12) United States Patent
Yu et al.

(10) Patent No.: US 6,211,008 B1
(45) Date of Patent: Apr. 3, 2001

(54) METHOD FOR FORMING HIGH-DENSITY HIGH-CAPACITY CAPACITOR

(75) Inventors: Jie Yu; Yelehanka Ramachandramurthy Pradeep; Henry Gerung; Jun Qian, all of Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 0 days.

(21) Appl. No.: 09/528,241

(22) Filed: Mar. 17, 2000

(51) Int. Cl.[7] .............................................. H01L 21/8242
(52) U.S. Cl. .................... 438/253; 438/254; 438/239; 438/238; 438/381; 438/396; 438/3
(58) Field of Search ................................. 438/253, 254, 438/239, 238, 381, 396, 3

(56) References Cited

U.S. PATENT DOCUMENTS

| | | | |
|---|---|---|---|
| 5,065,273 | * 11/1991 | Rajeevakumar | 361/313 |
| 5,075,817 | * 12/1991 | Butler | 361/313 |
| 5,595,928 | 1/1997 | Lu et al. | 437/52 |
| 5,712,202 | 1/1998 | Liaw et al. | 438/253 |
| 5,854,105 | * 12/1998 | Tseng | 438/253 |
| 5,909,621 | 6/1999 | Hsia et al. | 438/254 |
| 5,912,492 | 6/1999 | Chang et al. | 257/344 |
| 5,942,787 | 8/1999 | Gardner et al. | 257/408 |
| 5,972,722 | * 10/1999 | Visokay et al. | 438/3 |
| 5,994,197 | * 11/1999 | Liao | 438/396 |
| 6,037,216 | * 3/2000 | Liu et al. | 438/253 |

* cited by examiner

Primary Examiner—Matthew Smith
Assistant Examiner—V. Yevsikov
(74) Attorney, Agent, or Firm—George O. Saile; Roseman L. S. Pike

(57) ABSTRACT

A method for fabricating a high-density high-capacity capacitor is described. A dielectric layer is provided overlying a semiconductor substrate. A sacrificial layer is deposited overlying the dielectric layer and patterned to form a pattern having a large surface area within a small area on the substrate. In one alternative, spacers are formed on sidewalls of the patterned sacrificial layer. Thereafter, the sacrificial layer is removed. A bottom capacitor plate layer is conformally deposited overlying the spacers. In a second alternative, a bottom capacitor plate layer is deposited overlying the patterned sacrificial layer and etched to leave spacers on sidewalls of the patterned sacrificial layer. Thereafter, the sacrificial layer is removed. In both alternatives, a capacitor dielectric layer is deposited overlying the bottom capacitor plate layer. A top capacitor plate layer is deposited overlying the capacitor dielectric layer and patterned to complete fabrication of a high-density high-capacity capacitor.

20 Claims, 9 Drawing Sheets

METHOD FOR FORMING HIGH-DENSITY HIGH-CAPACITY CAPACITOR

BACKGROUND OF THE INVENTION

(1) Field of the Invention

The present invention relates to a method of fabricating a capacitor, and more particularly, to a method of fabricating a capacitor having large capacitor surface area on a minimum chip area in the fabrication of an integrated circuit device.

(2) Description of the Prior Art

Capacitors are critical components in the integrated circuit devices of today. As the technology in the semiconductor industry grows, the physical geometry of the semiconductor devices shrink. While maintaining the required capacitance, it is desirable to form the capacitor on as small a chip area as possible, thus reducing cell size.

U.S. Pat. No. 5,942,787 to Gardner teaches a method of using polysilicon spacers as a mask for making very small polysilicon features. U.S. Pat. No. 5,912,492 to Chang et al shows a capacitor having spacers over a FOX. U.S. Pat. No. 5,909,621 to Hsia et al, U.S. Pat. No. 5,854,105 to Tseng, and U.S. Pat. No. 5,712,202 to Liaw et al show capacitor processes using spacers of various types. U.S. Pat. No. 5,595,928 to Lu et al shows a process for forming polysilicon pillar capacitors.

SUMMARY OF THE INVENTION

Accordingly, it is a primary object of the invention to provide an effective and very manufacturable process for fabricating a capacitor in the fabrication of integrated circuits.

Another object of the present invention is to provide a method for fabricating a high-density high-capacity capacitor in the fabrication of integrated circuits.

A further object of the present invention is to provide a method for fabricating a high-density high-capacity capacitor in a process compatible with the double poly layer process in the fabrication of integrated circuits.

In accordance with the objects of this invention, a method for fabricating a high-density high-capacity capacitor is achieved. A dielectric layer is provided overlying a semiconductor substrate. A sacrificial layer is deposited overlying the dielectric layer and patterned to form a pattern having a large surface area within a small area on the substrate. Spacers are formed on sidewalls of the patterned sacrificial layer. Thereafter, the sacrificial layer is removed. A bottom capacitor plate layer is conformally deposited overlying the spacers. A capacitor dielectric layer is deposited overlying the bottom capacitor plate layer. A top capacitor plate layer is deposited overlying the capacitor dielectric layer and pattern to complete fabrication of a high-density high-capacity capacitor.

Also in accordance with the objects of this invention, another method for fabricating a high-density high-capacity capacitor is achieved. A dielectric layer is provided overlying a semiconductor substrate. A sacrificial layer is deposited overlying the dielectric layer and patterned to form a pattern having a large surface area within a small area on said substrate. A bottom capacitor plate layer is deposited overlying the patterned sacrificial layer and etched to leave spacers on sidewalls of the patterned sacrificial layer. Thereafter, the sacrificial layer is removed. A capacitor dielectric layer is conformally deposited overlying the bottom capacitor plate layer. A top capacitor plate layer is deposited overlying the capacitor dielectric layer and patterned to complete fabrication of a high-density high-capacity capacitor.

BRIEF DESCRIPTION OF THE DRAWINGS

In the following drawings forming a material part of this description, there is shown.

DESCRIPTION OF THE PREFERRED EMBODIMENTS

The process of the present invention provides a method for fabricating a capacitor having a very large capacitor surface area, thus achieving high capacitance on minimum chip area. Two preferred embodiments of the present invention are described below. The first embodiment of the present invention will be described with reference to FIGS. 1 through 7. The second embodiment of the invention will be described with reference to FIGS. 8 through 17. It will be understood by those skilled in the art that the process of the present invention should not be limited to the two embodiments described herein, but can be extended and applied to other capacitor configurations.

Figure 1:
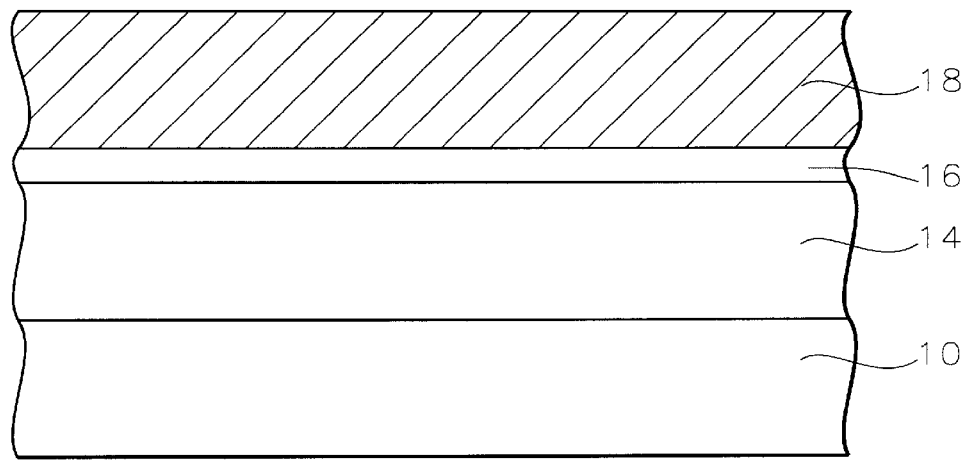
FIGS. 1 through 7 are schematic cross-sectional representations of a first preferred embodiment of the present invention.

The first preferred embodiment of the present invention will now be described with reference to FIGS. 1 through 7. Referring now more particularly to FIG. 1, there is shown a partially completed integrated circuit device. The semiconductor substrate 10 is preferably composed of silicon having a (100) crystallographic orientation. Semiconductor device structures are formed in and on the semiconductor substrate. These may include gate electrodes and interconnection lines and associated source and drain regions and lower levels of metallization. The semiconductor device structures, not shown, may be formed in layer 14 and covered with an insulating layer.

Now, a dielectric layer 16 is formed over the layer 14. Layer 16 may be silicon oxide having a thickness of between about 100 and 300 Angstroms. Now, a sacrificial polysilicon layer 16 is deposited by chemical vapor deposition (CVD) over the oxide layer 18 to a thickness of between about 2000 and 5000 Angstroms.

Figure 2:
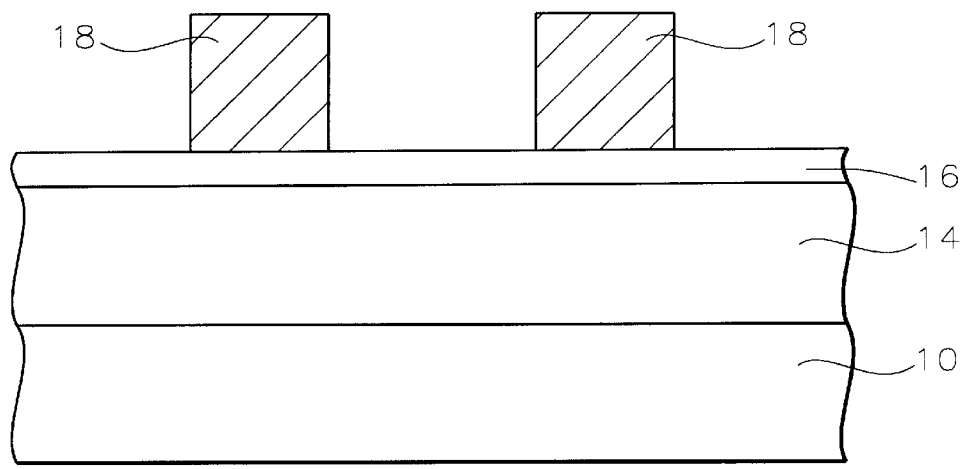

The sacrificial polysilicon layer 18 is patterned as shown in FIG. 2 for a minimum spacing between polysilicon lines.

Figure 3:
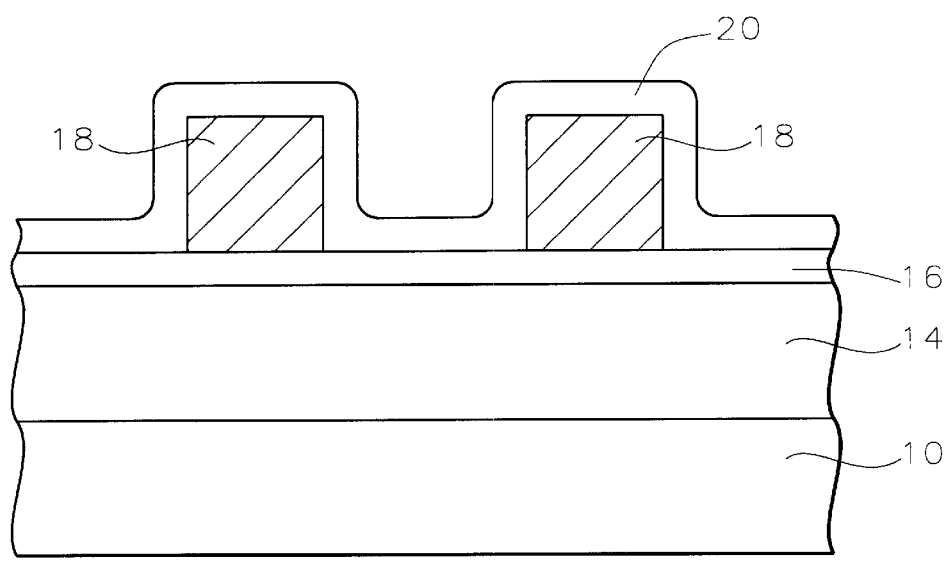

A dielectric layer 20 is deposited conformally over the patterned sacrificial polysilicon layer 18, as shown in FIG. 3. the dielectric layer 20 may comprise silicon nitride or ONO (silicon oxide/silicon nitride/silicon oxide) and have a thickness of between about 100 and 500 Angstroms.

Figure 4:
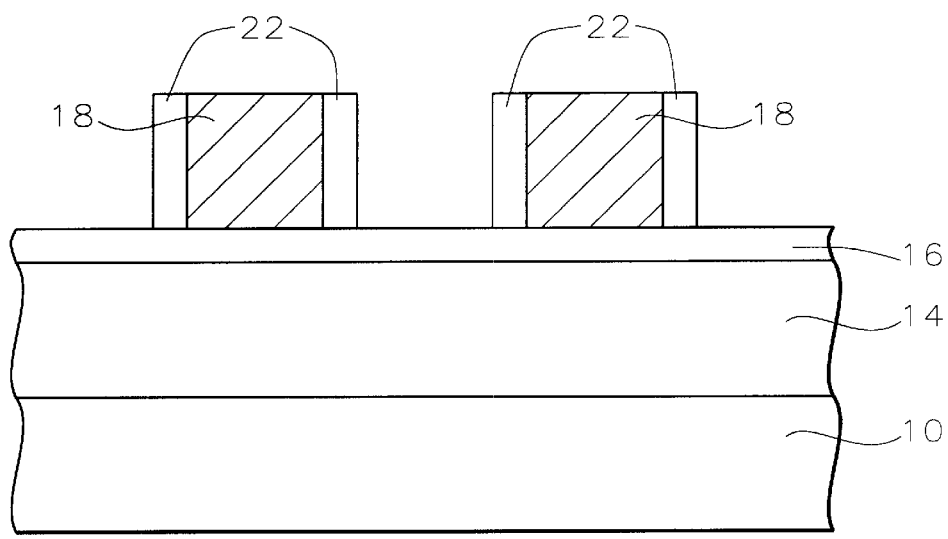

The dielectric layer 20 is anisotropically etched back to leave spacers 22 on the sidewalls of the patterned sacrificial polysilicon layer 18, as shown in FIG. 4.

Figure 5:
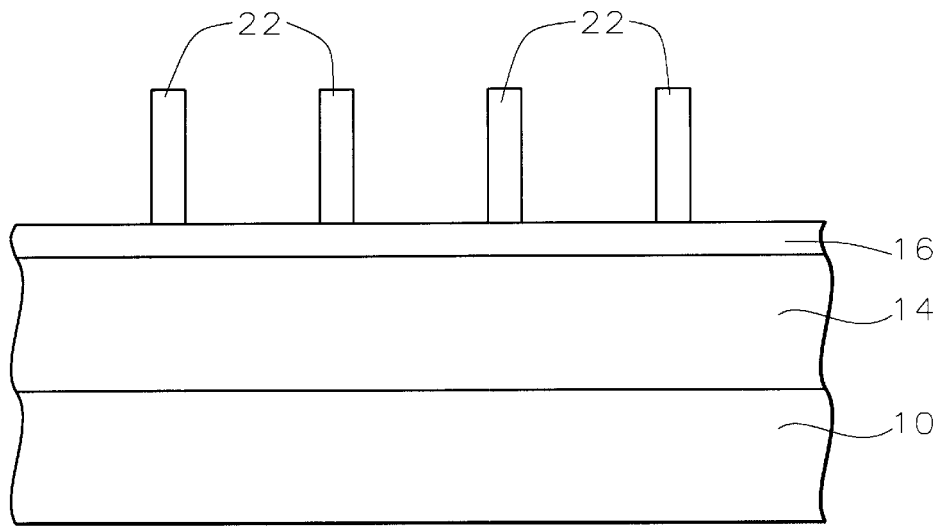

Referring now to FIG. 5, the sacrificial polysilicon layer 18 is etched away using a high selectivity etching, leaving the dielectric spacers 22 as pillars over the oxide layer 16. The high selectivity etching may use $Cl_2/HBr/O_2$ chemistry, for example.

Figure 6:
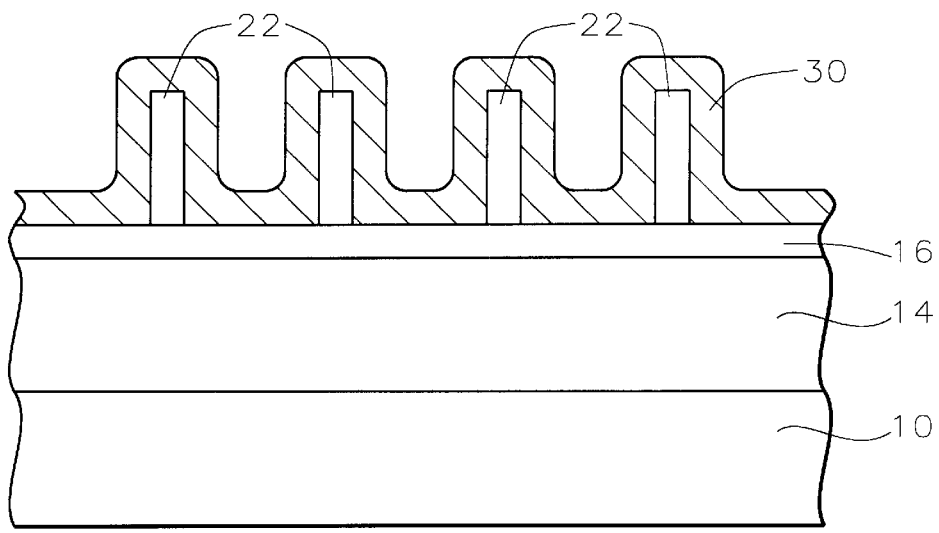

Now, the bottom plate polysilicon layer 30 is deposited conformally over the oxide layer and the dielectric spacers 22. Because of the topography of the dielectric spacers over the oxide layer, the bottom plate polysilicon is "corrugated," resulting in a large surface area, but within a minimum chip area. The bottom plate polysilicon is shown in FIG. 6.

Figure 7:
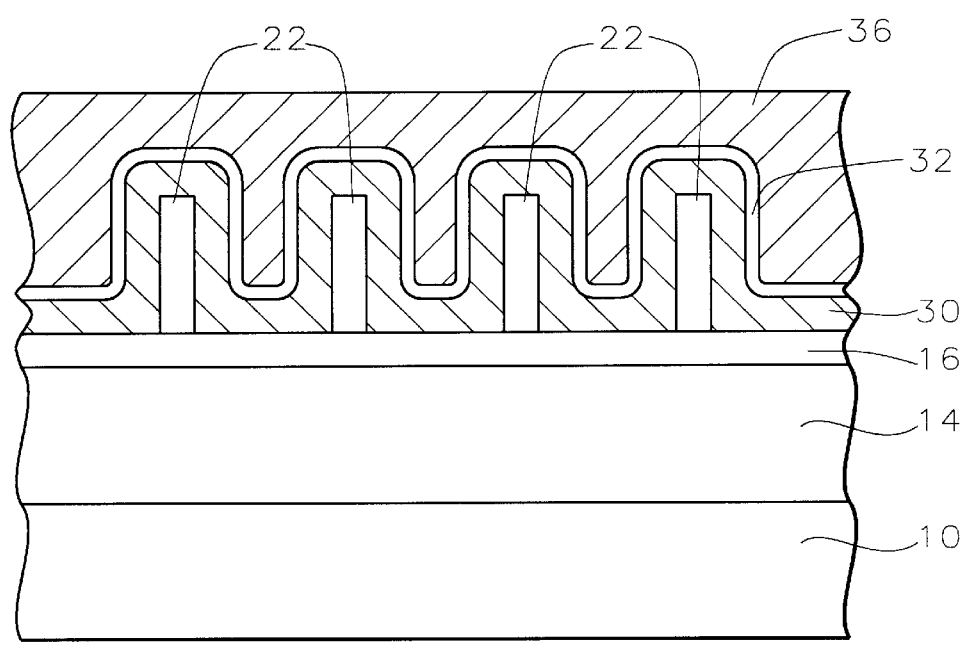

Referring now to FIG. 7, a capacitor dielectric layer 32 is deposited over the bottom capacitor plate 30. The capacitor dielectric may comprise silicon nitride, silicon oxynitride, ONO (oxide/nitride/oxide), NO (nitride/oxide), or any other suitable dielectric. The thickness of the capacitor dielectric layer 32 is typically between about 100 and 300 Angstroms. The top polysilicon plate layer 36 is deposited to a thickness of between about 1000 and 3000 Angstroms and patterned to complete fabrication of the capacitor of the invention.

The process of the invention provides a method for forming a capacitor having a large surface area, but on a minimum chip area, thus providing a high-density capacitor. The capacitor surface area can be well-controlled by varying the thickness of the sacrificial polysilicon layer.

Figure 8:
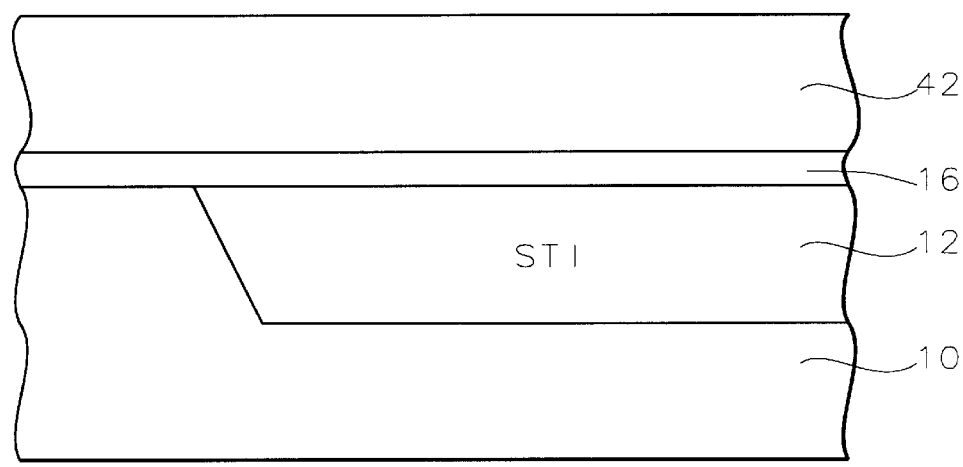
FIGS. 8, 9, 11 through 13, 15, and 16 are schematic cross-sectional representations of a second preferred embodiment of the present invention.

The second preferred embodiment of the present invention will now be described with reference to FIGS. 8 through 17. Referring now more particularly to FIG. 8, there is shown a partially completed integrated circuit device. The semiconductor substrate 10 is preferably composed of silicon having a (100) crystallographic orientation. Semiconductor device structures may be formed in and on the semiconductor substrate. These may include gate electrodes and interconnection lines and associated source and drain regions and lower levels of metallization. Alternatively, the capacitor may be formed over an isolation region in a semiconductor substrate. This second alternative will be illustrated in the figures, but it should be understood that the capacitor of the invention may be formed in any appropriate layer of the integrated circuit. For example, shallow trench isolation region 12 has been formed in the semiconductor substrate 10 as is conventional in the art.

Now, a silicon oxide layer 16 is formed over the substrate, such as by thermal oxidation or by chemical vapor deposition, to a thickness of between about 100 and 300 Angstroms. Then a silicon nitride layer 42 is deposited by CVD over the oxide layer 16 to a thickness of between about 2000 and 5000 Angstroms.

Figure 9:
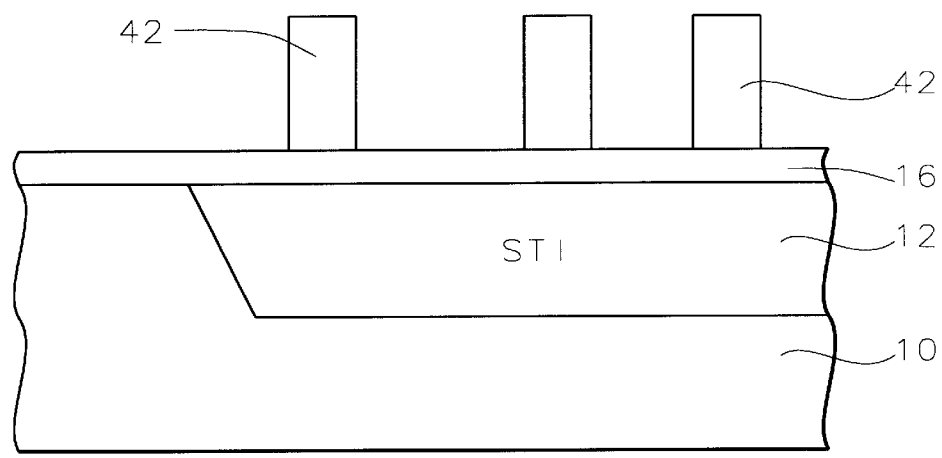
Figure 10:
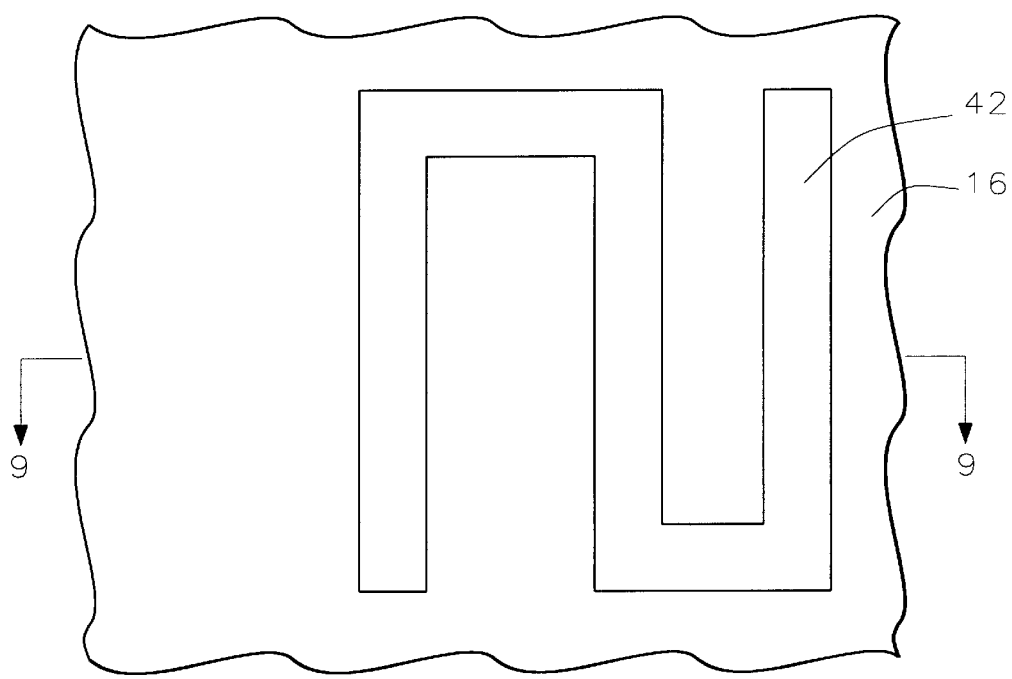
FIG. 10 is a top view of FIG. 9 in the second preferred embodiment of the present invention.

The nitride layer 42 is patterned as shown in FIG. 9 and as shown in top view in FIG. 10. The nitride layer is patterned to have a large surface area within a small area on the substrate.

Figure 11:
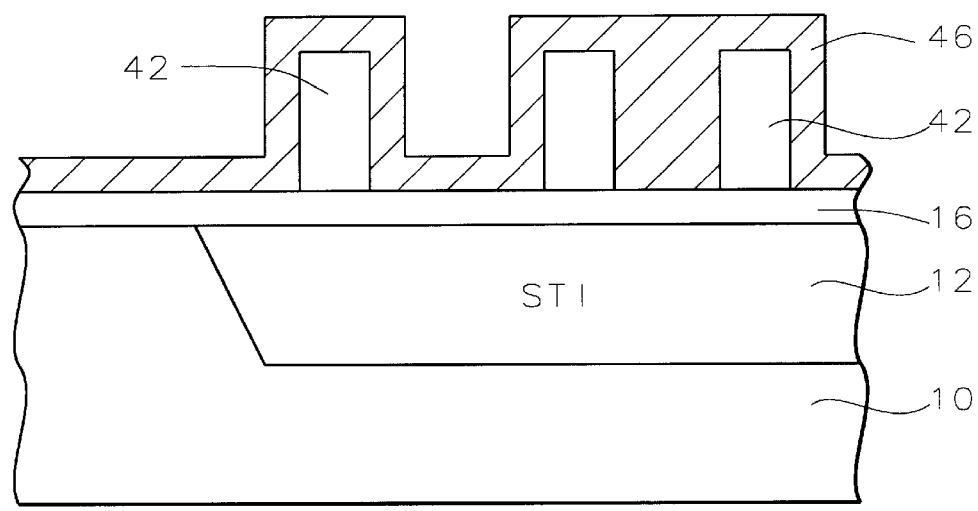

A polysilicon layer 46 is deposited conformally over the patterned nitride layer 42, as shown in FIG. 11. The polysilicon layer 46 may have a thickness of between about 500 and 1500 Angstroms.

Figure 12:
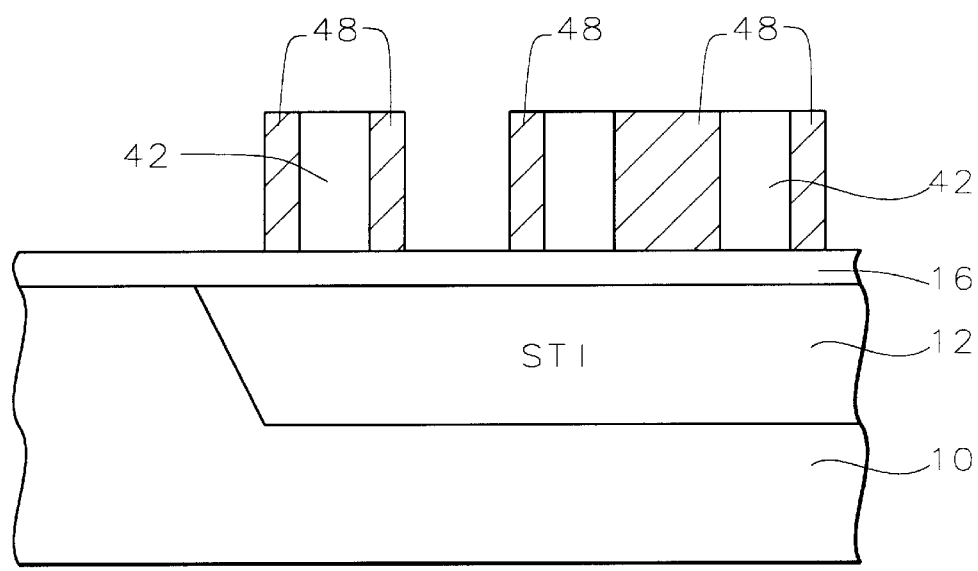

The polysilicon layer 46 is anisotropically etched back to leave polysilicon spacers 48 on the sidewalls of the patterned nitride layer 42, as shown in FIG. 12.

Figure 13:
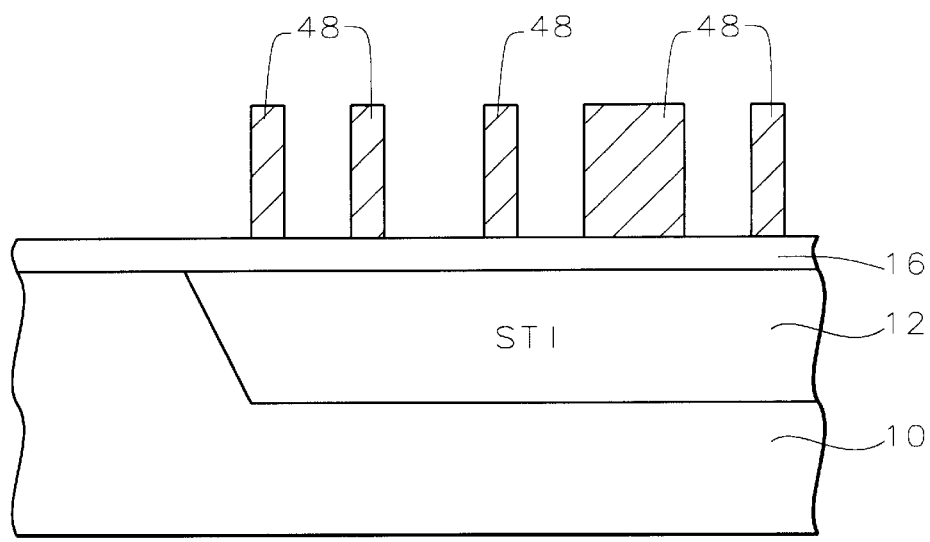
Figure 14:
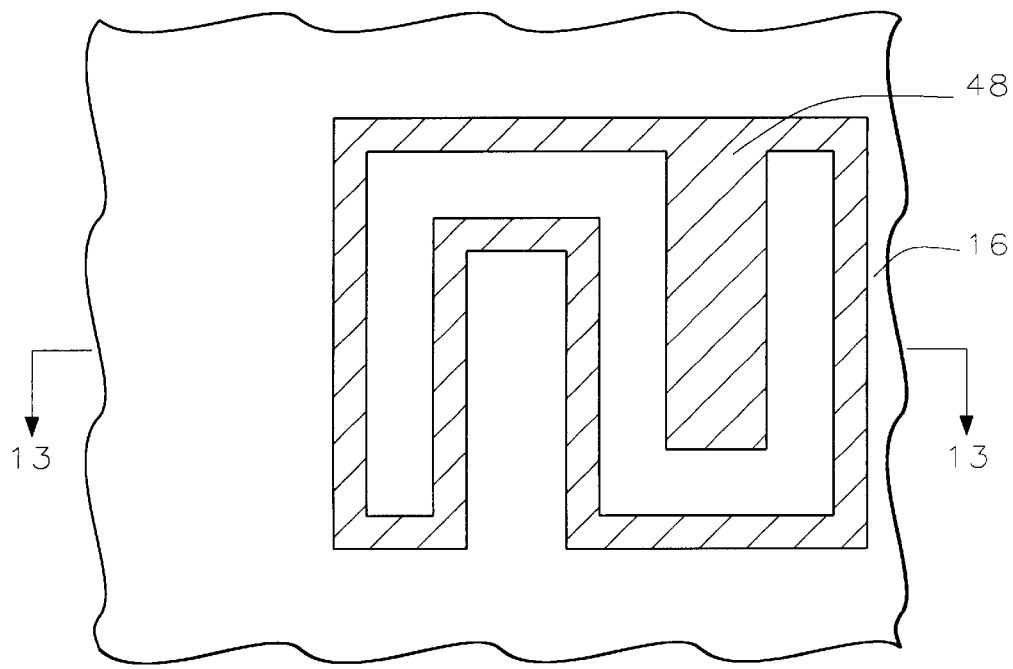
FIG. 14 is a top view of FIG. 13 in the second preferred embodiment of the present invention.

Referring now to FIG. 13, the nitride layer 42 is etched away using a wet etching method. This leaves only the polysilicon spacers 48. FIG. 14 shows a top view of the polysilicon 48. The polysilicon 48 forms the bottom plate electrode. It can be seen from the top view in FIG. 14 that the bottom plate electrode 48 has a large surface area within a small chip area because of the patterning of the nitride layer.

Figure 15:
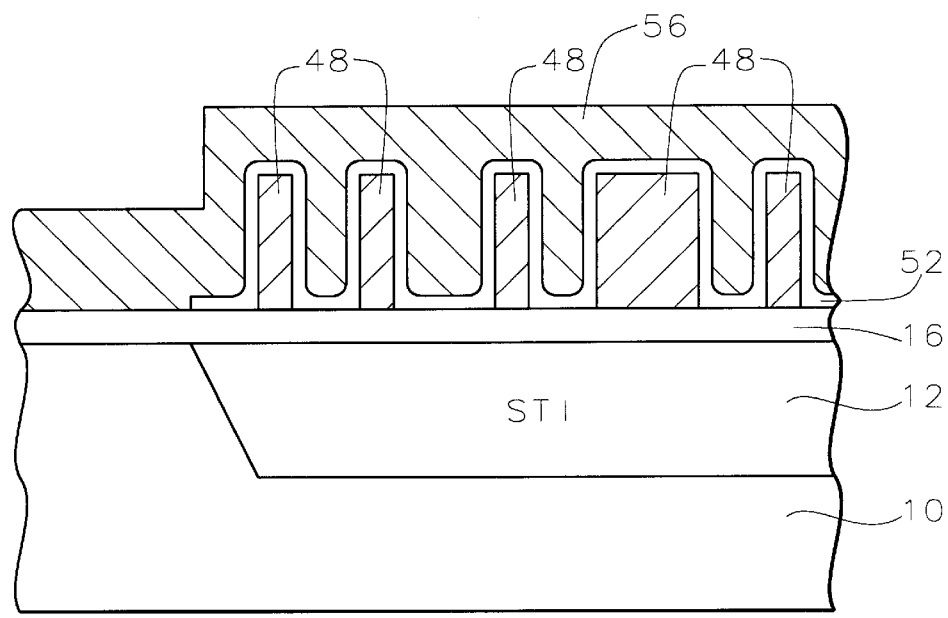

Referring now to FIG. 15, a capacitor dielectric layer 52 is deposited over the bottom capacitor plate 48. The capacitor dielectric may comprises silicon nitride, silicon oxynitride, ONO (oxide/nitride/oxide), NO (nitride/oxide), or any other suitable dielectric. The thickness of the capacitor dielectric layer 52 is typically between about 100 and 300 Angstroms. The top polysilicon plate layer 56 is deposited to a thickness of between about 1000 and 3000 Angstroms.

Figure 16:
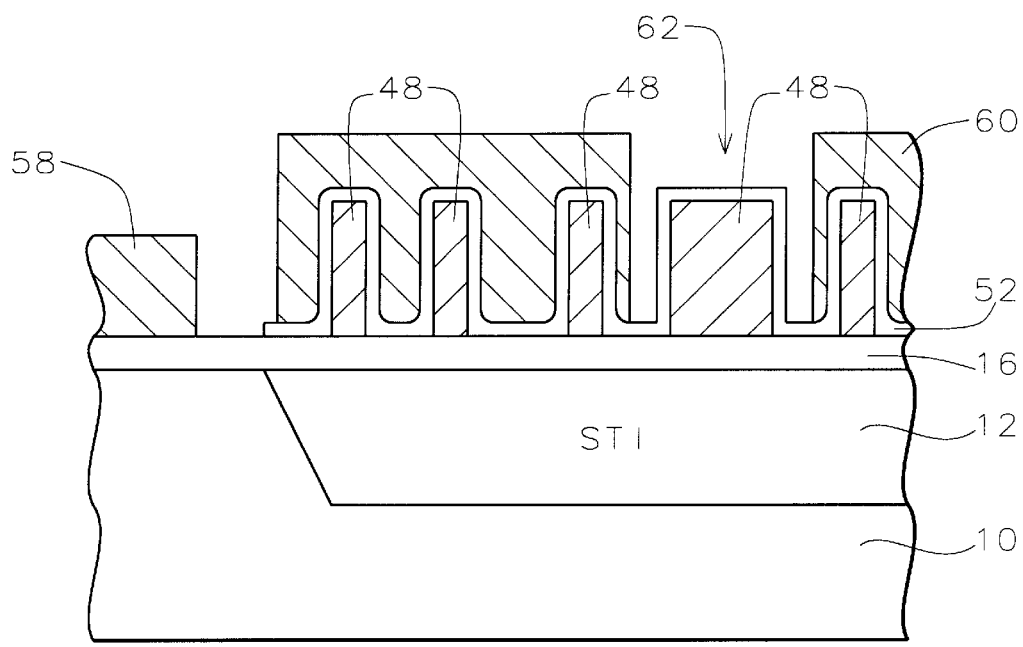
Figure 17:
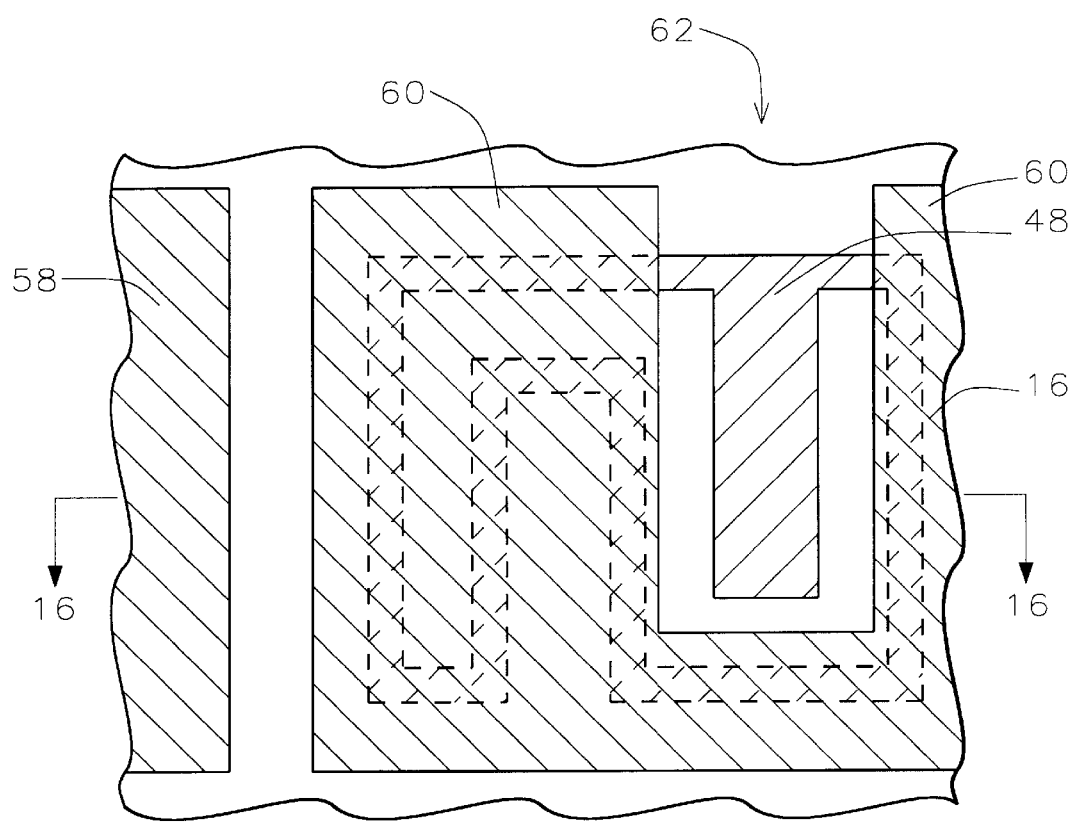
FIG. 17 is a top view of FIG. 16 in the second preferred embodiment of the present invention.

Referring now to FIGS. 16 and 17, the top polysilicon layer 56 is patterned to form a polysilicon gate 58 and to form the top capacitor plate 60 with a contact opening 62. Processing then continues as is conventional in the art to complete fabrication of the integrated circuit.

The process of the invention provides a method for forming a capacitor having a large surface area, but on a minimum chip area, thus providing a high-density capacitor. This embodiment of the invention is compatible with the double polysilicon layer process. The formation of the top capacitor plate is combined with the polysilicon gate formation.

The process of the present invention provides methods to form a high-density high-capacity capacitor by using a sacrificial layer which is patterned to form a large surface area on a small chip area. This allows the bottom capacitor plate to be formed such that it has a large surface area within a minimum chip area.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a high-density high-capacity capacitor comprising:

providing a dielectric layer overlying a semiconductor substrate;

depositing a sacrificial layer overlying said dielectric layer and patterning said sacrificial layer to form a pattern having a large surface area within a small area on said substrate;

forming spacers on sidewalls of said patterned sacrificial layer;

thereafter removing said sacrificial layer;

conformally depositing a bottom capacitor plate layer overlying said spacers;

depositing a capacitor dielectric layer overlying said bottom capacitor plate layer; and depositing a top capacitor plate layer overlying said capacitor dielectric layer and patterning said top capacitor plate layer to complete said fabrication of said high-density high-capacity capacitor.

2. The method according to claim 1 wherein said semiconductor substrate includes semiconductor device structures such as gate electrodes and source and drain regions.

3. The method according to claim 1 wherein said dielectric layer comprises silicon oxide.

4. The method according to claim 1 wherein said sacrificial layer comprises polysilicon.

5. The method according to claim 1 wherein said sacrificial layer has a thickness of between about 2000 and 5000 Angstroms.

6. The method according to claim 1 wherein said spacer layer comprises one of the group containing: silicon nitride and ONO.

7. The method according to claim 1 wherein said capacitor dielectric layer comprises one of the group containing: ONO, silicon oxynitride, silicon nitride, and NO (nitride/oxide).

8. A method for fabricating a high-density high-capacity capacitor comprising:

providing a dielectric layer overlying a semiconductor substrate;

depositing a sacrificial layer overlying said dielectric layer and patterning said sacrificial layer to form a corrugated pattern having a large surface area within a small area on said substrate;

conformally depositing a bottom capacitor plate layer overlying said patterned sacrificial layer and etching said bottom capacitor plate layer to leave spacers on sidewalls of said patterned sacrificial layer;

thereafter removing said sacrificial layer;

conformally depositing a capacitor dielectric layer overlying said bottom capacitor plate layer; and depositing a top capacitor plate layer overlying said capacitor dielectric layer and patterning said top capacitor plate layer to complete said fabrication of said high-density high-capacity capacitor.

9. The method according to claim 8 wherein said an isolation layer is formed in semiconductor substrate and wherein said capacitor is formed overlying said isolation layer.

10. The method according to claim 8 wherein said dielectric layer comprises silicon oxide.

11. The method according to claim 8 wherein said sacrificial layer comprises silicon nitride.

12. The method according to claim 8 wherein said bottom capacitor plate layer comprises polysilicon.

13. The method according to claim 8 wherein said capacitor dielectric layer comprises one of the group containing: ONO, silicon oxynitride, silicon nitride, and NO (nitride/oxide).

14. The method according to claim 8 wherein said top capacitor plate layer comprises polysilicon.

15. A method for fabricating a high-density high-capacity capacitor comprising:

forming a shallow trench isolation region within a semiconductor substrate wherein said capacitor will be formed overlying said shallow trench isolation region;

forming a dielectric layer overlying said semiconductor substrate;

depositing a sacrificial layer overlying said dielectric layer and patterning said sacrificial layer to form a corrugated pattern having a large surface area within a small area on said substrate;

conformally depositing a bottom capacitor plate layer overlying said patterned sacrificial layer and etching said bottom capacitor plate layer to leave spacers on sidewalls of said patterned sacrificial layer;

thereafter removing said sacrificial layer;

conformally depositing a capacitor dielectric layer overlying said bottom capacitor plate layer;

depositing a top capacitor plate layer overlying said capacitor dielectric layer; and patterning said top capacitor plate layer to form a a gate electrode in an active area of said semiconductor substrate not overlying said shallow trench isolation region and to form a top capacitor plate overlying said bottom capacitor plate layer wherein a contact opening is formed through said top capacitor plate layer and through said capacitor dielectric layer to a portion of said bottom capacitor plate layer to complete said fabrication of said high-density high-capacity capacitor.

16. The method according to claim 15 wherein said dielectric layer comprises silicon oxide.

17. The method according to claim 15 wherein said sacrificial layer comprises silicon nitride.

18. The method according to claim 15 wherein said bottom capacitor plate layer comprises polysilicon.

19. The method according to claim 15 wherein said capacitor dielectric layer comprises one of the group containing: ONO, silicon oxynitride, silicon nitride, and NO (nitride/oxide).

20. The method according to claim 15 wherein said top capacitor plate layer comprises polysilicon.

* * * * *

UNITED STATES PATENT AND TRADEMARK OFFICE
CERTIFICATE OF CORRECTION

PATENT NO. : 6,211,008 B1　　　　　　　　　　　　　　　　　　　　Page 1 of 1
DATED : April 3, 2001
INVENTOR(S) : Jie Yu, Yelehanka Ramachandramurthy Pradeep, Henry Gerung, Jun Qian It is certified that error appears in the above-identified patent and that said Letters Patent is hereby corrected as shown below:

<u>Title page,</u>
Item [74], correct "Roseman L.S. Pike" so that it reads -- Rosemary L. S. Pike --

Signed and Sealed this

Sixteenth Day of October, 2001

Attest:

*Nicholas P. Godici*

NICHOLAS P. GODICI
*Attesting Officer*　　*Acting Director of the United States Patent and Trademark Office*